(12) United States Patent
Wang et al.

(10) Patent No.: US 7,667,265 B2
(45) Date of Patent: Feb. 23, 2010

(54) VARYING MESA DIMENSIONS IN HIGH CELL DENSITY TRENCH MOSFET

(75) Inventors: Qi Wang, Sandy, UT (US); Gordon George Sim, Sandy, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 11/482,676

(22) Filed: Jul. 7, 2006

(65) Prior Publication Data
US 2007/0176231 A1 Aug. 2, 2007

Related U.S. Application Data

(60) Provisional application No. 60/763,567, filed on Jan. 30, 2006.

(51) Int. Cl.
*H01L 29/76* (2006.01)
(52) U.S. Cl. .................................. 257/330; 257/401
(58) Field of Classification Search ................. 257/213, 257/288, 327–330, 368, 401; 438/149, 197
See application file for complete search history.

(56) References Cited

U.S. PATENT DOCUMENTS

| 5,072,266 | A | | 12/1991 | Bulucea et al. | |
|---|---|---|---|---|---|
| 5,572,048 | A | * | 11/1996 | Sugawara | 257/132 |
| 6,049,108 | A | * | 4/2000 | Williams et al. | 257/341 |
| 6,140,678 | A | | 10/2000 | Grabowski et al. | |
| 6,444,527 | B1 | * | 9/2002 | Floyd et al. | 438/268 |
| 6,696,726 | B1 | | 2/2004 | Bencuya et al. | |
| 6,911,693 | B2 | * | 6/2005 | Zundel et al. | 257/332 |
| 2003/0060013 | A1 | * | 3/2003 | Marchant et al. | 438/270 |
| 2004/0021173 | A1 | * | 2/2004 | Sapp | 257/330 |
| 2004/0191994 | A1 | * | 9/2004 | Williams et al. | 438/270 |
| 2005/0167742 | A1 | * | 8/2005 | Challa et al. | 257/328 |
| 2006/0220156 | A1 | * | 10/2006 | Saito et al. | 257/409 |
| 2007/0090470 | A1 | * | 4/2007 | Heringa | 257/409 |

OTHER PUBLICATIONS

International Search Report and Written Opinion of PCT Application No. PCT/US07/01846, date of mailing Apr. 17, 2008, 9 pages total.

* cited by examiner

*Primary Examiner*—Lynne A. Gurley
*Assistant Examiner*—Vernon P Webb
(74) *Attorney, Agent, or Firm*—Townsend and Townsend and Crew LLP

(57) ABSTRACT

Circuits, methods, and apparatus for power MOSFETs having a high cell density for a high current carrying capability while maintaining a low pinched-base resistance. One device employs a number of transistor cells having varying mesa (regions between trench gates) sizes. A heavy body etch is utilized in larger cells to reduce the pinched-base resistance. This etch removes silicon in the mesa region, which is then replaced with lower-impedance aluminum. A number of smaller cells that do not receive this etch are used to increase device current capacity. Avalanche current is directed to the larger, lower pinched base cells by ensuring these cells have a lower BVDSS breakdown voltage. The large cell BVDSS can be varied by adjusting the critical dimension or width of the trench gates on either side of the wider mesas, or by adjusting the depth of the heavy body etch.

20 Claims, 7 Drawing Sheets

↑ ↑ ↑
Mesa Mesa Trench

VARYING MESA DIMENSIONS IN HIGH CELL DENSITY TRENCH MOSFET

BACKGROUND

The present invention generally relates to power MOSFET transistors and more particularly to power MOSFET transistors having a variety of mesa dimensions.

The use of power MOSFETs is quickly becoming ubiquitous and their popularity is sure to spread in the coming years as they are called upon to serve in an increasing number of applications. But the demands of these applications are placing a burden on the performance of these devices. Accordingly, power MOSFET devices having improved performance are needed.

During typical operation, when conducting, a power MOSFET pulls current through an inductor. When the power MOSFET turns off, the inductor retains a stored energy. This stored energy generates a current though the inductor that decreases over time as a function of the quality factor or "Q" of the inductor. The current is dissipated in the power MOSFET as that device enters the avalanche breakdown mode.

Avalanche current passes through a power MOSFET device via its body diode, that is, the junction between its drain and well regions. For an n-channel transistor, avalanche current flows from an N-type drain, through a P-well, to the heavy-body contact. Since the transistor is designed to handle this current, this action is not destructive.

However, if the well-to-source diode turns on, a secondary parasitic bipolar action can begin. This secondary bipolar action can lead to a runaway current that can be destructive to the device. The well-to-source diode can turn on if the well resistance is excessive, that is, if the pinched-base resistance is too high.

Accordingly, it is desirable to reduce the pinched base resistance to prevent the secondary bipolar action. But many techniques of reducing this resistor result in a larger cell size. A larger cell size reduces the number of cells that can be integrated and reduces device current carrying capacity.

Thus, what is needed are circuits, methods, and apparatus that provide power MOSFET transistors having a large number of cells while maintaining a low pinched-base resistance.

SUMMARY

Accordingly, embodiments of the present invention provide circuits, methods, and apparatus for power MOSFETs having a high cell density for a high current carrying capability while maintaining a low pinched-base resistance.

An exemplary embodiment of the present invention employs a number of transistor cells having varying mesa sizes. A mesa is the source region of a trench power MOSFET transistor, that is, a mesa is the region between trench gates. One specific embodiment uses two sizes of mesas for its cells, though other embodiments may use more than two sizes.

A specific embodiment of the present invention utilizes a heavy body etch to reduce the pinched-base resistance of a trench-gate power MOSFET. This etch removes silicon in the mesa region, which is then replaced with lower-impedance aluminum. But the cell size needed for a heavy body etch is larger than ideal for a high current capability device. Accordingly, this embodiment also utilizes a number of smaller mesa cells that do not receive this etch.

The smaller mesa cells have a higher pinched-base resistance. Thus, to prevent these devices from having a secondary bipolar breakdown, most of the device's avalanche current is directed to the larger, lower pinched base resistance cells. This can be done by ensuring these cells have a lower body-diode breakdown (BVDSS) voltage. Specifically, the BVDSS of the larger cells is made high enough to meet any required specification but lower then the small cells BVDSS breakdown voltage. The large cell BVDSS can be varied by adjusting the critical dimension (CD) or width of the trench gates on either side of the wider mesas, or by adjusting the depth of the heavy body etch.

The power MOSFET is then designed to have enough of the larger cells to handle the required avalanche current. The number of additional smaller cells that are needed to provide the required device current carrying capability can then be added. Various embodiments of the present invention may make use of one or more of these or the other features described herein.

A better understanding of the nature and advantages of the present invention may be gained with reference to the following detailed description and the accompanying drawings.

DESCRIPTION OF EXEMPLARY EMBODIMENTS

Figure 1:
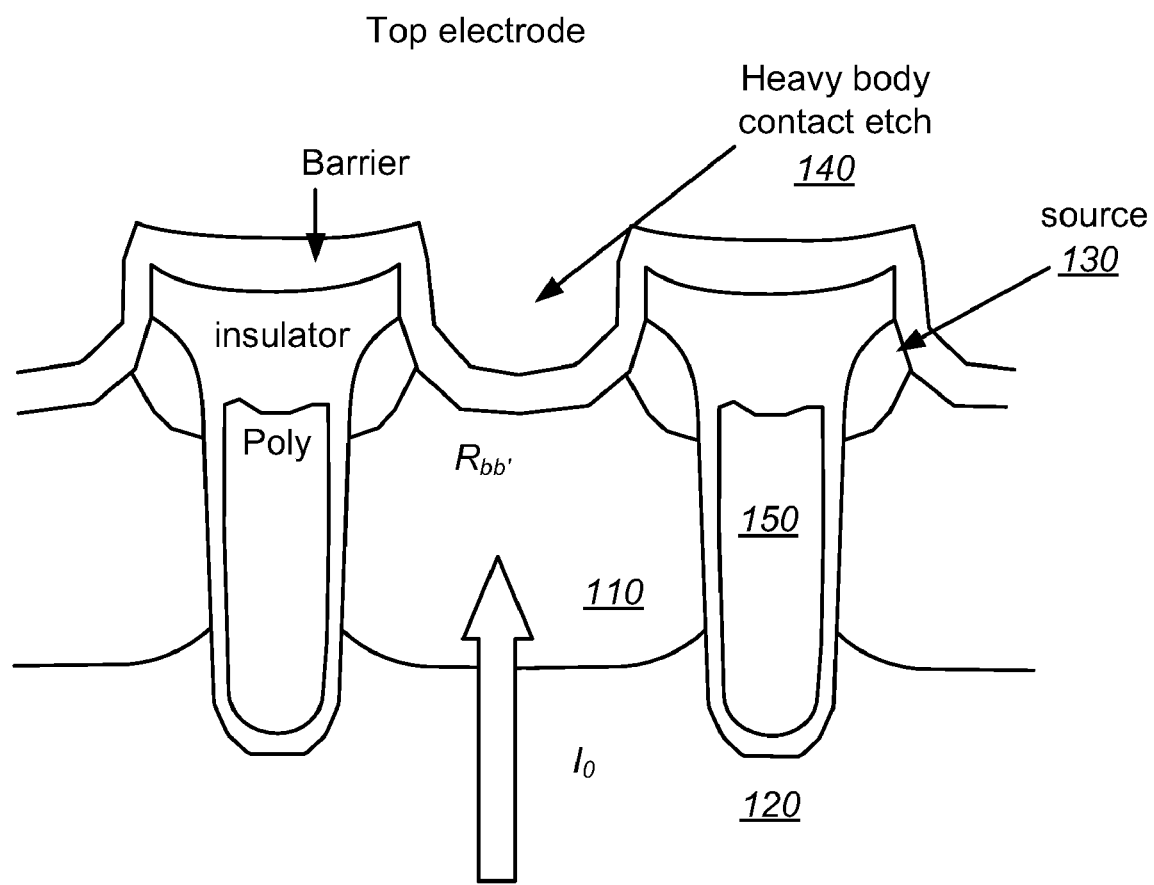
FIG. 1 is a side view of a transistor cell having a heavy body contact etch that may be incorporated by embodiments of the present invention.

FIG. 1 is a side view of a transistor cell having a heavy body contact etch that may be incorporated by embodiments of the present invention. This device includes a body or bulk region 110, drain and 120, and source regions 130.

Typically, when the transistor shown in FIG. 1 is turned on and conducting, it pulls current through an inductor. When the transistor turns off, the stored energy in the inductor generates a current, shown here as current Io, which flows through the device. This current creates an avalanche breakdown in the body diode. In embodiments of the present invention, this breakdown is not destructive and the transistor is designed to handle this current.

If the pinched base resistance becomes excessive however, the well-to-source diode may become forward biased and began conducting a significant amount of current. This diode acts as an emitter of a bipolar transistor. The resulting current due to this secondary bipolar effect is uncontrolled and can become large enough to be destructive to the device. To prevent the well-to-source diode from becoming forward biased, the device is modified using a heavy body contact etch that reduces the pinched base resistance, as shown in FIG. 1.

Specifically, a portion of the body in region 110 is removed by a heavy body contact etch 140. This approach includes removing silicon material from the mesa and replacing it with lower resistivity material such as aluminum.

This method works well in reducing the pinched base resistance of the device. However, a heavy body contact etch requires a wider mesa device, thereby reducing the total number of cells in a given device size. But it is desirable to include a large number of cells in a device to increase its current carrying capability, that is, to reduce its on resistance. Accordingly, an embodiment of the present invention uses as many of these wider cells as necessary to handle the inductor turn-off current, while using additional narrower cells to increase the total number of cells in the device for a low on resistance, that is, a high current carrying capability when turned on and conducting.

Figure 2:
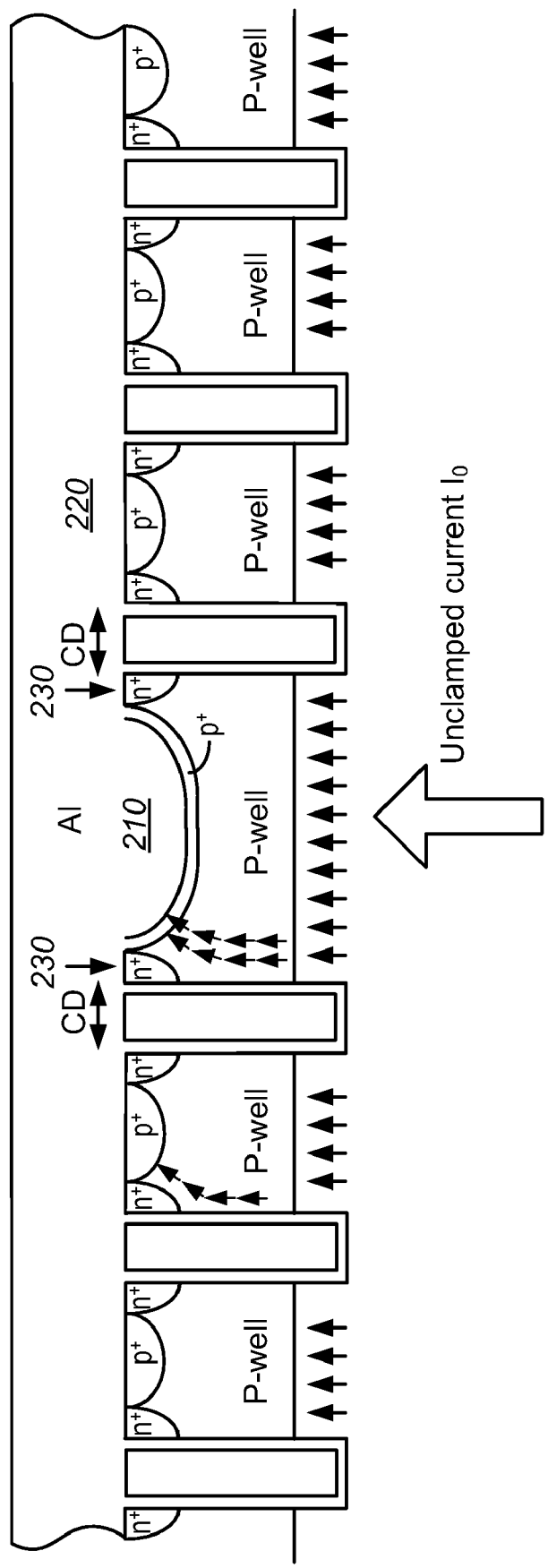
FIG. 2 is a side view of a transistor according to an embodiment of the present invention.

FIG. 2 illustrates a cell structure with two different mesa sizes that utilizes the low base resistance $R_{bb'}$ of the etched heavy body while also providing a high cell density. This figure includes a wide cell 210 and a number of narrower cells 220. The dimension of the mesa in the wide cell 210 is large enough for a heavy body contact etch, while the dimension of the mesa in the small cell 220 is small enough to maximize the trench density. For this structure, there are several parameters as following:

M: large mesa size;
$M_1$: small mesa size;
n: the number of large mesas per die;
$n_1$: number of small mesas per large mesa;
CD: the trench opening for large mesa; and
$CD_1$: the trench opening for small mesa.

Again, when this device turns off, an avalanche current ($I_0$) results from the stored energy in the load inductor. There are two scenarios for this body-diodes breakdown.

In the first scenario, the breakdown occurs in body diodes in both wide and narrow mesas or cells simultaneously. The current flow through the larger mesa will be $M/M_1$ times more than through the small mesa because of the body-diode areas. To prevent the well-to-source diode from conducting (being forward biased by more than 0.6 volts), the requirement of "pinched-base" resistance of small mesa $R_{bb'}$ is:

$$R_{bb'}^{small} < 0.6 \left( \frac{M}{M_1} + n_1 \right) \frac{n}{I_0} \quad \text{[Equation 1]}$$

According to this model, increasing the number of large mesa per die(n), or the number of small mesas for every large mesa($n_1$), or increasing the ratio of the large mesa size to the small mesa size ($M/M_1$) significantly reduces the requirements for heavy body structure in small mesa. This reduction enables a non-etched heavy body structure on small mesas and increase further trench density.

In the second scenario, which is a more accurate way of modeling an actual device with this structure, an adjacent cell screening effect makes the breakdown occur to the body-diodes in large mesa areas first. The unclamped inductance current ($I_0$) flows primarily through the large mesas. The upper limit for the pinched-base resistance is:

$$R_{bb'}^{large} < 0.6 \frac{n}{I_0} \quad \text{[Equation 2]}$$

The UIS performance, that is, the performance when the device is in an avalanche breakdown, is primarily determined by the number of large mesas per die and the inductance current, and depends to a lesser extent on the pinched-base resistance of the narrow or small mesa cells. This enables further increases in the number of cells by reducing the pitch of small mesa area. The source 230 in large mesa area is optional, depending on both forward current and UIS requirements.

To ensure that the avalanche current flows primarily in the wide cells, the body-diode breakdown voltage of the wide cells should be less than the breakdown voltage of small mesa cells, though the breakdown of the wide cells still needs to meet any applicable BVDSS specification. Thus, it is desirable that the BVDSS of large mesa diode be controllable.

Figure 3:
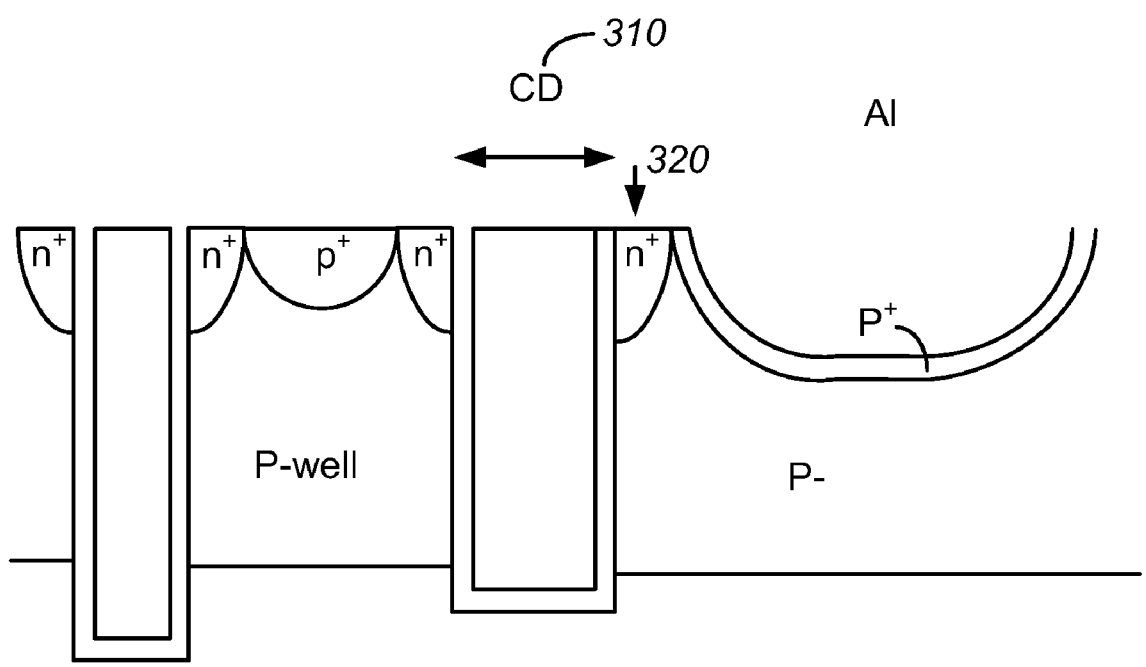
FIG. 3 is a side view of adjacent narrow and wide transistor cells according to an embodiment of the present invention.

The body-diode breakdown BVDSS of a large mesa can be smaller than that of a small mesa by either changing the depth of the trench adjacent to the large mesa or by changing the depth of etched heavy body. In the first approach, a different trench depth can be realized for the large mesa trenches under the same trench etching by changing trench opening (CD) 310, as shown in FIG. 3. Also, the source 320 in the large mesa is optional, depending on the requirements for device UIS performance and forward current conductivity.

Figure 4A:
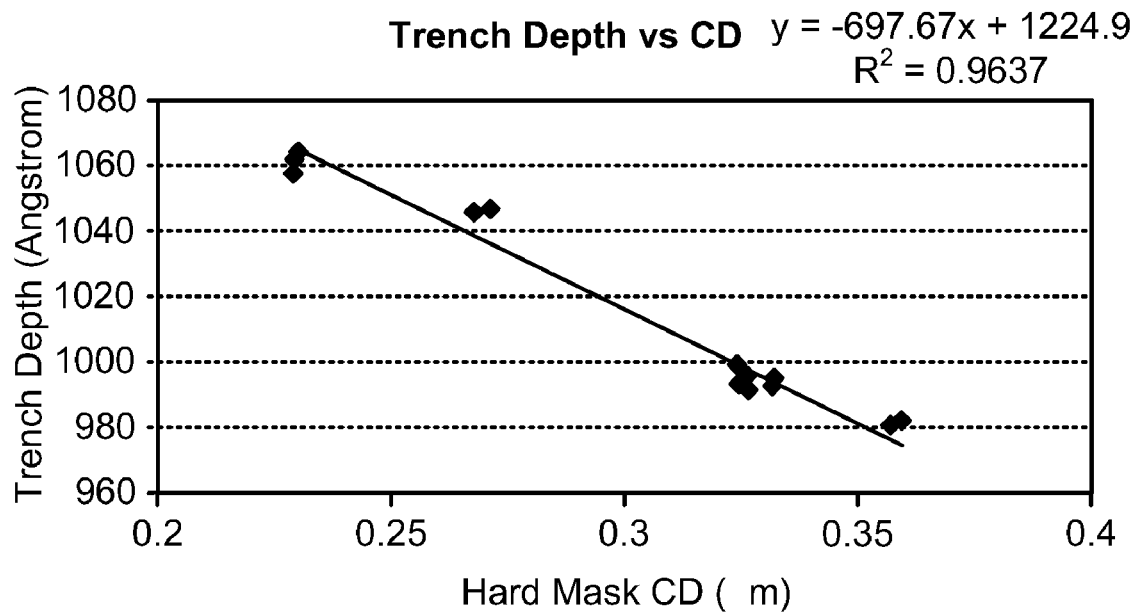
FIG. 4A illustrates the change in device trench depth as a function of trench gate width.

FIG. 4A illustrates the change in device trench depth as a function of trench gate width. This graph illustrates that the larger the trench CD is, the shallower a trench is. This is important since BVDSS is a function of trench depth, as shown in the next figure.

Figure 4B:
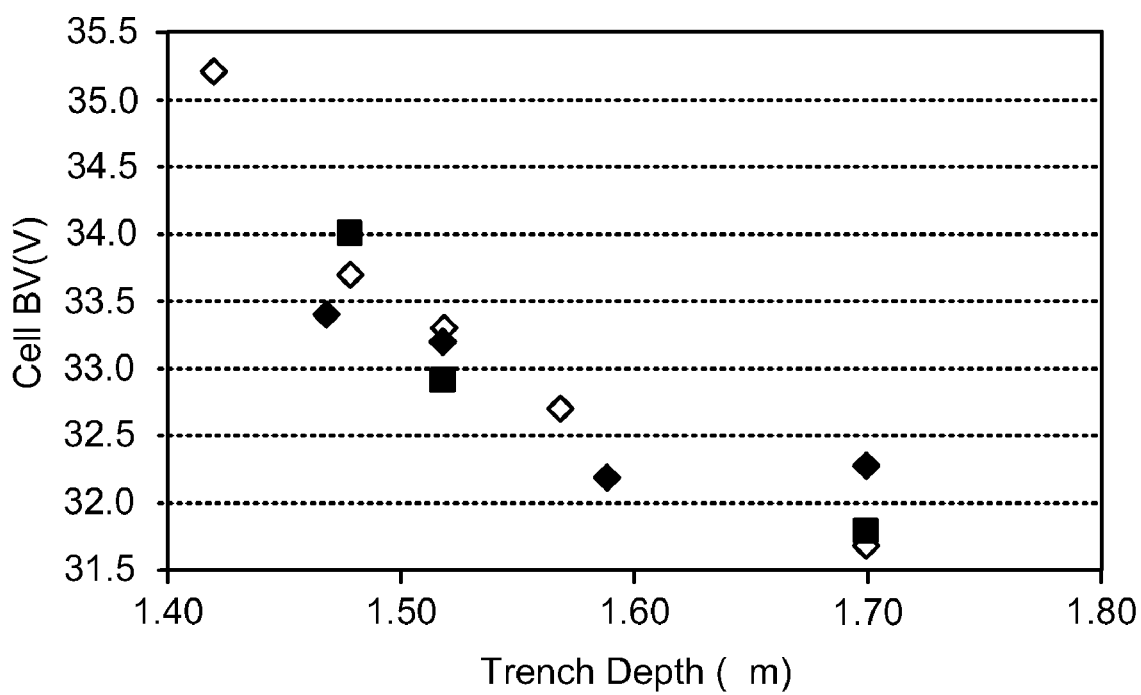
FIG. 4B illustrates the change in breakdown voltage as a function of trench depth.

FIG. 4b illustrates the change in breakdown voltage as a function of trench depth. This graph indicates how BVDSS changes with the trench depth. The shallower a trench is, the higher the breakdown voltage. Utilizing these two effects, the CDs of the trenches adjacent to large mesas can be used to make the BVDSS of the large mesa body-diode higher than a specification but lower than that of small mesa cells.

In the second approach that can be used to adjust BVDSS, the depth of a heavy body contact on a mesa can be controlled through heavy body etch. The heavy body on the large mesa can be etched to such a depth that punch through occurs on the body diodes in this region. Both approaches can be used to ensure the wide cells take the bulk of the avalanche current.

One drawback of the heavy body etch has been that it is difficult to accurately control. However, in a device according to an embodiment of the present invention, cells having this etch are only a part of the total number of cells in the device. Accordingly, the variation of Rdson due to the heavy body contact etch is significantly reduced. Specifically, only a fraction (about $(1+n_1)^{-1}$) of trenches in a die have etched heavy-body contact, the heavy body contact induced variation is thus reduced by $(1+n_1)$ times.

In a specific embodiment of the present invention, the values of M (the large mesa size) and CD (the trench opening for large mesa) are determined by the required BVDSS. The value of $M_1$ (the small mesa size) is determined by the photolithography capability and the implant capabilities used to fabricate the source and heavy body regions, which in practice translate to the design rules being used. The value of n (the number of large mesas) is determined by the UIS specification, that is, there needs to be enough large mesa devices to handle the required off current without turning on the source-to-well diode according to equation 2. The value of $n_1$ (the number of small mesa cells for each large mesa cell) is determined by the on-resistance specification.

Figure 5:
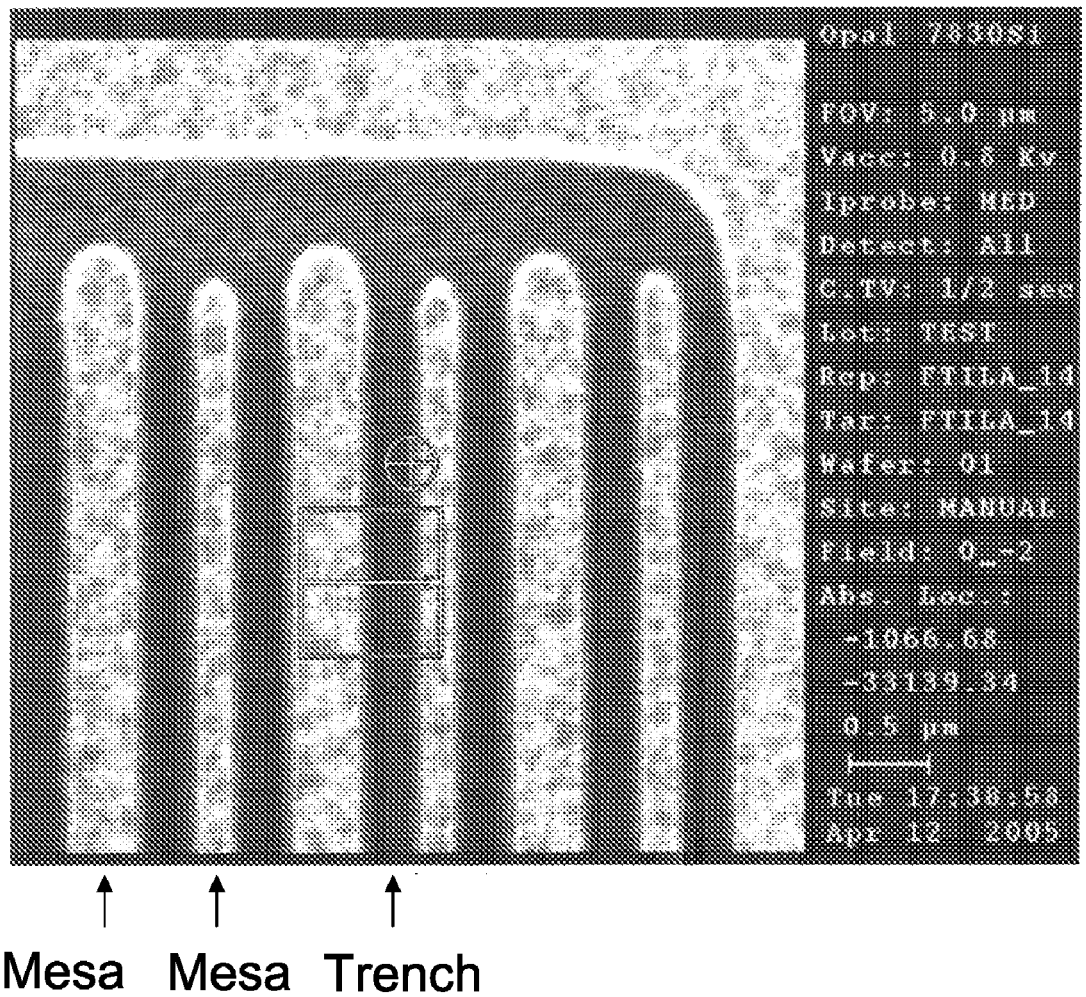
FIG. 5 is a top view of a transistor according to an embodiment of the present invention.

In fabricating this structure, the required varying mesa and trench sizing are patterned on the photo mask layout and transferred to the wafer using lithographic/etching techniques. FIG. 5 shows a SEM image of an actual trench pattern with an alternating source or mesa size as an example. The patterning has been completed through the etching of the trenches. The required etched heavy-body contact is also defined using lithographic/etching techniques by defining the etched contact in the heavy-body region of the larger mesa.

Figure 6:
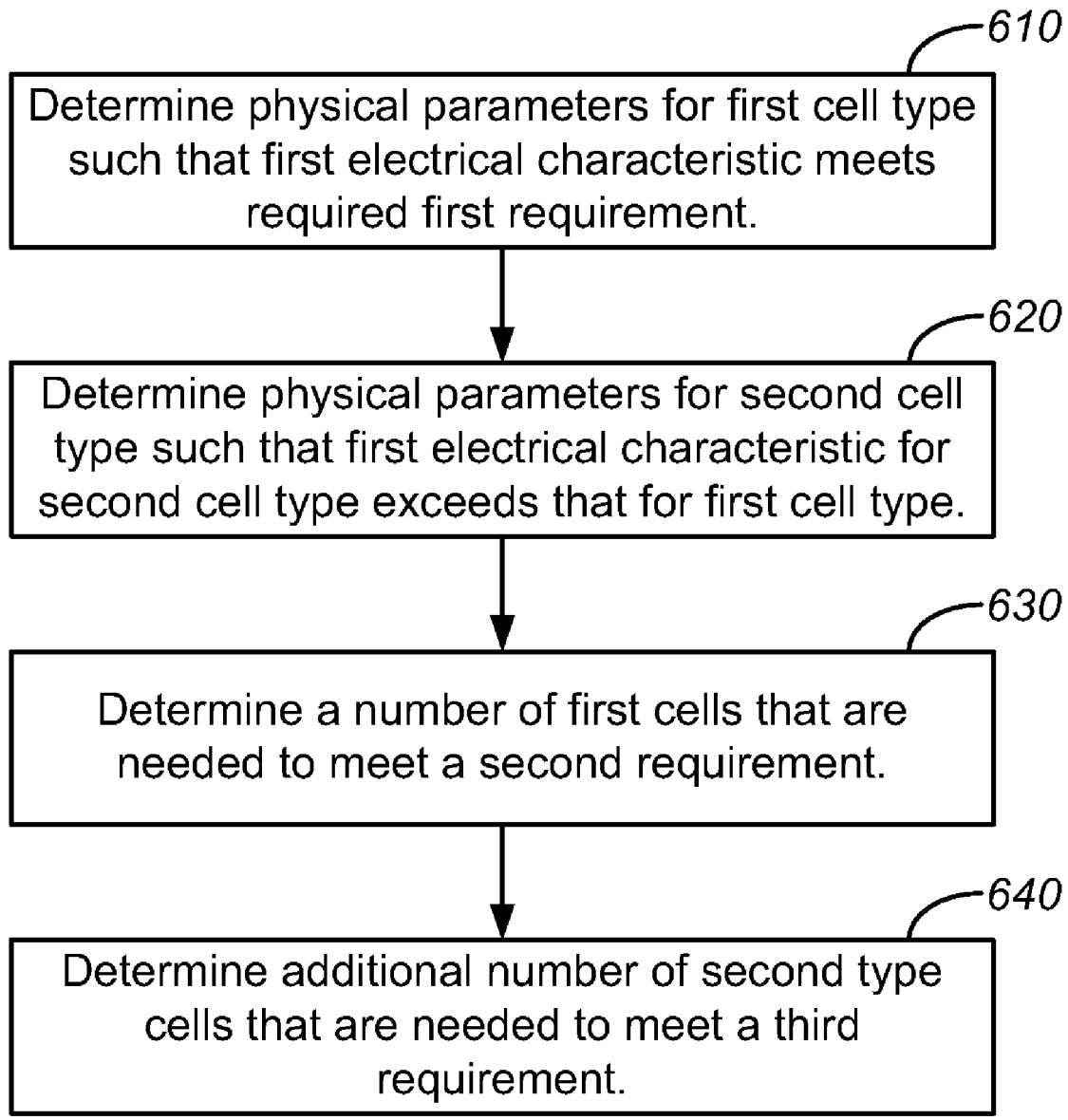
FIG. 6 is a flowchart illustrating a method of designing a power MOSFET device consistent with an embodiment of the present invention.

FIG. 6 is a flowchart illustrating a method of designing a power MOSFET device consistent with an embodiment of the present invention. In this embodiment, physical parameters for a first and second cell type are found. The numbers of each type of cells needed to satisfy one or more electrical characteristics are determined. From these determinations, a power MOSFET according to an embodiment of the present invention can be layed out and manufactured.

Specifically, physical parameters for a first cell type are determined such that a first electrical characteristic meets a required specification in act 610. In various embodiments of the present invention the parameters include but are not limited to trench width CDs, heavy body etch depths, mesa width, or other physical parameter. The first electrical characteristic may be the BVDSS as described above, or it may be a different electrical characteristic.

In act 620, physical parameters for a second cell type are determined such that the first electrical characteristic not only meets the required specification but exceeds it. For example, the BVDSS of the second cell type can be set higher than the BVDSS of the first cell type, such that the first cell type takes the brunt of any turn-off current.

The number of the first type of cells can then be found to meet a second requirement. For example, the number of wide cells needed to handle the turn off current without turning on the source-to-well diode can be found in act 630. In act 640, the number of the second type of cells needed to meet a third requirement can be determined. For example, the number of narrow cells that are additionally needed to provide the required on resistance can be found.

Figure 7:
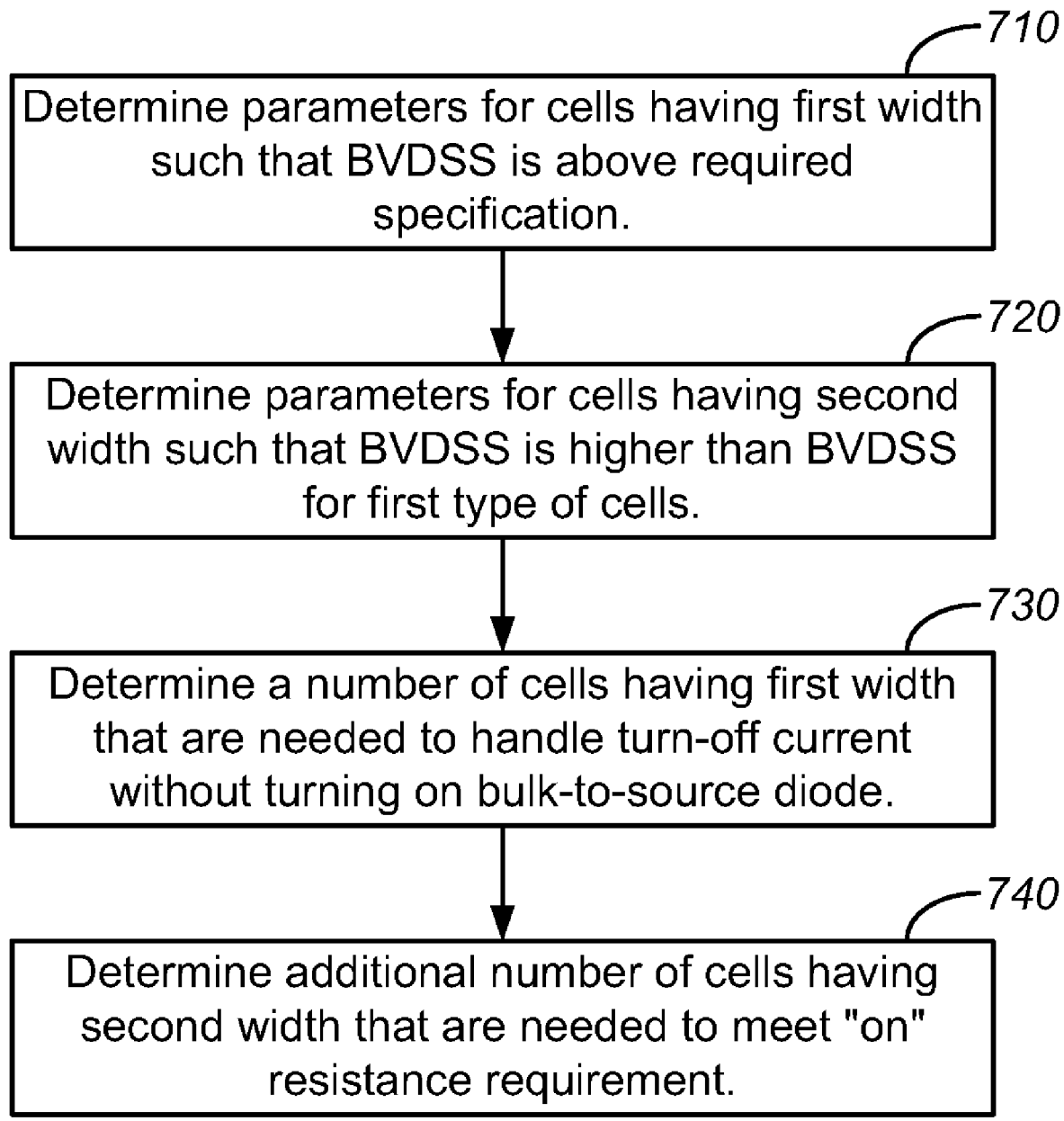
FIG. 7 is another flowchart illustrating a method of designing a power MOSFET device consistent with an embodiment of the present invention.

FIG. 7 is another flowchart illustrating a method of designing a power MOSFET device consistent with an embodiment of the present invention. In act 710, parameters for cells having a first width are determined such that the cell BVDSS is above specification. The parameters found may include but are not limited to trench width CDs, heavy body etch depths, mesa width, or other physical parameter. Parameters for cells having a second width are found in act 720. These cells have a BVDSS that is higher than the BVDSS of the cells having the first width. Typically, most of these parameters are the minimum design rules allowed by the process technology being used.

In act 730, the number of cells having the first width that are needed to handle the required turn-off current without allowing the source-to-well diode to conduct is determined. The number of additional cells having the second width that are needed to meet the on resistance requirement is determined in act 740. Using this information, a power MOSFET according to an embodiment of the present invention can then be layed out and manufactured.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

For example, it is understood that the doping polarities of the structures shown and described could be reversed and/or the doping concentrations of the various elements could be altered without departing from the invention. As another example, the present invention is shown and described in the context of a vertical MOSFET embodiment, but various embodiments of the present invention can be similarly implemented in other trenched gate structures such as trenched gate IGBTs, lateral trenched-gate MOSFETs, as well as vertical and lateral planar-gate MOSFETs and IGBTs. Also, the various transistor embodiments can be laid out using the well known open-cell or closed-cell configurations.

What is claimed is:

1. A field effect transistor comprising:
    a first plurality of cells having a first cell pitch, the first plurality of cells having gates with first mesa regions extending between the gates, wherein a heavy body contact opening extends into each first mesa region, and a heavy body region extends in each first mesa regions along a bottom of corresponding heavy body contact opening; and
    a second plurality of cells having a second cell pitch, the second cell pitch being narrower than the first cell pitch, the second plurality of cells having gates with second mesa regions extending between the gates, wherein no heavy body contact opening is formed in the second mesa regions, and a heavy body region extends in each second mesa region to a shallower depth than a depth to which the heavy body regions in the first mesa regions extend;
    wherein each of the gates in the first and second plurality of cells is housed in a trench, each mesa region in the first and second plurality of cells including a well region, the well regions in at least the second plurality of cells including source regions having a conductivity type opposite that of the well regions;
    wherein each of the heavy body regions in the first and the second mesa regions is located in a corresponding well region, the heavy body regions being of the same conductivity type as but having a higher doping concentration than the well regions.

2. The transistor of claim 1 wherein the heavy body region in each first mesa regions is used to control a body-diode breakdown voltage for the first plurality of cells.

3. The transistor of claim 1 wherein a width of a trench is used to control a body-diode breakdown voltage for the first plurality of cells.

4. The transistor of claim 1 wherein a desired turn off current specification is used to determine a number of cells in the first plurality of cells.

5. The transistor of claim 4 wherein a desired on resistance is used to determine a number of cells in the second plurality of cells.

6. The transistor of claim 1 wherein the second pitch is determined by minimum design rules.

7. The transistor of claim 1 wherein at least one of the trenches extending adjacent one of the mesa regions in the first plurality of cells is shallower than at least one of the trenches extending adjacent one of the mesa regions in the second plurality of cells.

8. The transistor of claim 1 further comprising a top electrode contacting the source regions and the heavy body regions in the second plurality of cells, the top electrode further extending into the heavy body contact openings to contact the heavy body regions in the first plurality of cells.

9. A trench-gate power field effect transistor comprising:
a first trench gate;
a second trench gate displaced from the first trench gate by a first distance in a first direction, the region between the first and second trench gates being free from trench gates;
a third trench gate displaced from the second trench gate by a second distance in a second direction opposite the first direction, the region between the second and third trench gates being free from trench gates;
a first well region located between the first trench gate and the second trench gate, the first well region having a heavy body contact opening extending therein;
a first heavy body region extending in the first well region along a bottom of the heavy body contact opening;
a second well region located between the second trench gate and the third trench gate, the second well region having no heavy body contact opening extending therein; and
a second heavy body region extending in the second well region to a shallower depth than a depth to which the first heavy body region extends,
wherein the first distance is larger than the second distance.

10. The transistor of claim 9 wherein only the first well region receives a heavy body etch so that a heavy body contact opening is formed in the first well region but not in the second well region.

11. The transistor of claim 9 wherein the first trench gate is shallower than the third trench gate.

12. The transistor of claim 9 wherein at least the second well region includes source regions having a conductivity type opposite that of the first and second well regions, and each of the first, second and third trench gates includes a gate therein.

13. The transistor of claim 12 wherein the first and second heavy body regions are of the same conductivity type as but have a higher doping concentration than the first and second well regions.

14. The transistor of claim 13 further comprising a top electrode contacting the source regions and the second heavy body region, the top electrode further extending into the heavy body contact opening to contact the first heavy body region.

15. A field effect transistor comprising:
a first pair of gates with a first well region extending between the first pair of gates, and with no gates between the first pair of gates;
a second pair of gates with a second well region extending between the second pair of gates, and with no gates between the second pair of gates, wherein of the first and second well regions, only the first well region has a heavy body contact opening extending therein, and the first well region has a lateral width greater than a lateral width of the second well region;
a first heavy body region extending in the first well region along a bottom of the heavy body contact opening; and
a second heavy body region extending in the second well region to a shallower depth than a depth to which the first heavy body region extends.

16. The transistor of claim 15 further comprising:
a first pair of trenches each housing one of the first pair of gates, a spacing between the first pair of trenches defining the lateral width of the first well region; and
a second pair of trenches each housing one of the second pair of gates, a spacing between the second pair of trenches defining the lateral width of the second well region.

17. The transistor of claim 16 wherein the first pair of trenches extend to a shallower depth than do the second pair of trenches.

18. The transistor of claim 15 wherein at least the second well region includes source regions therein, the source regions having a conductivity type opposite that of the first and second well regions.

19. The transistor of claim 18
wherein the first and second heavy body regions are of the same conductivity type as but have a higher doping concentration than the first and second well regions.

20. The transistor of claim 19 further comprising a top electrode contacting the source regions and the second heavy body region, the top electrode further extending into the heavy body contact opening to contact the first heavy body region.

* * * * *